United States Patent
Chen et al.

(10) Patent No.: US 11,258,026 B2
(45) Date of Patent: Feb. 22, 2022

(54) NANOPARTICLE, METHOD FOR PREPARING DISPLAY SUBSTRATE AND DISPLAY DEVICE

(71) Applicants: BEIJING BOE TECHNOLOGY DEVELOPMENT CO., LTD., Beijing (CN); BOE TECHNOLOGY GROUP CO., LTD., Beijing (CN)

(72) Inventors: Zhuo Chen, Beijing (CN); Wenhai Mei, Beijing (CN)

(73) Assignees: BEIJING BOE TECHNOLOGY DEVELOPMENT CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 161 days.

(21) Appl. No.: 16/406,795

(22) Filed: May 8, 2019

(65) Prior Publication Data

US 2020/0127219 A1    Apr. 23, 2020

(30) Foreign Application Priority Data

Oct. 18, 2018   (CN) .......................... 201811215851.2

(51) Int. Cl.
    *H01L 51/50*      (2006.01)
    *C09K 11/02*      (2006.01)
    (Continued)

(52) U.S. Cl.
    CPC .......... *H01L 51/502* (2013.01); *C09K 11/025* (2013.01); *C09K 11/883* (2013.01);
    (Continued)

(58) Field of Classification Search
    CPC ................................................... H01L 51/502
    See application file for complete search history.

(56) References Cited

U.S. PATENT DOCUMENTS 2,915,484 A  * 12/1959 Kohler ................ C07D 303/04
                                                        525/507
10,224,483 B2 *  3/2019 Li ......................... G03F 7/0047
                        (Continued)

FOREIGN PATENT DOCUMENTS

CN         1866470 A    11/2006
CN       102177095 A     9/2011
            (Continued)

OTHER PUBLICATIONS

First Office Action for Chinese Application No. 201811215851.2, dated May 21, 2020, 7 Pages.

*Primary Examiner* — William D Young
(74) *Attorney, Agent, or Firm* — Brooks Kushman P.C.

(57) ABSTRACT

The nanoparticle of the embodiments of the present disclosure includes nanograins, and a first ligand and a second ligand connected to a surface of each nanograin, wherein the first ligand has alkali solubility, and the second ligand undergoes a crosslinking reaction when heated. The method for preparing the display substrate according to embodiments of the present disclosure includes: forming a nanoparticle layer on a substrate; coating a photoresist on the nanoparticle layer, exposing the photoresist with a mask; developing to remove the photoresist in the photoresist removal region, such that the exposed nanoparticle layer is dissolved into a developing solution; performing post-baking treatment, such that a second ligand of the nanoparticle covered by the photoresist in the photoresist reserved region undergoes a crosslinking reaction, and the nanoparticle layer covered by the photoresist in the photoresist reserved region is fixed on the substrate; and stripping the photoresist, to complete a patterning of the nanoparticle layer.

10 Claims, 3 Drawing Sheets

(51) Int. Cl.
*C09K 11/88* (2006.01)
*G03F 7/16* (2006.01)
*H01L 27/32* (2006.01)
*H01L 51/00* (2006.01)
*H01L 51/56* (2006.01)
*B82Y 20/00* (2011.01)
*B82Y 40/00* (2011.01)

(52) U.S. Cl.
CPC .......... *G03F 7/168* (2013.01); *H01L 27/3244* (2013.01); *H01L 51/0018* (2013.01); *H01L 51/0026* (2013.01); *H01L 51/0052* (2013.01); *H01L 51/0065* (2013.01); *H01L 51/56* (2013.01); *B82Y 20/00* (2013.01); *B82Y 40/00* (2013.01)

(56) References Cited

U.S. PATENT DOCUMENTS

| | | |
|---|---|---|
| 2010/0068522 A1 | 3/2010 | Pickett et al. |
| 2018/0108842 A1 | 4/2018 | Li et al. |
| 2019/0112491 A1 | 4/2019 | Mei |
| 2019/0207136 A1 | 7/2019 | Chen et al. |
| 2020/0028106 A1* | 1/2020 | Li .................. H01L 51/5036 |

FOREIGN PATENT DOCUMENTS

| | | |
|---|---|---|
| CN | 105070849 A | 11/2015 |
| CN | 105552241 A | 5/2016 |
| CN | 106957645 A | 7/2017 |
| CN | 107603340 A | 1/2018 |
| CN | 108172603 A | 6/2018 |

* cited by examiner

NANOPARTICLE, METHOD FOR PREPARING DISPLAY SUBSTRATE AND DISPLAY DEVICE

CROSS-REFERENCE TO RELATED APPLICATION

This application claims priority to Chinese Patent Application No. 201811215851.2 filed on Oct. 18, 2018, which is incorporated herein by reference in its entirety.

TECHNICAL FIELD

The embodiments of the present disclosure relate to the field of display, and in particular, to a nanoparticle, a method for preparing a display substrate, and a display device.

BACKGROUND

Quantum dots (QDs), also known as nanocrystals, are nanograins composed of Groups II-VI or III-V elements. The particle size of quantum dots is generally between 1 nm and 20 nm. Quantum dots can emit fluorescence after being excited because electrons and holes are quantum confined, a continuous band structure becomes a discrete energy level structure.

With the in-depth development of the technology for preparing quantum dots, the stability and luminous efficiency of quantum dots keep increasing. Along with the development of the research of quantum light-emitting diode (QLED), the prospects for the application of QLED in display field are becoming brighter. However, the current QLED production efficiency has not yet reached the mass production level, in which the most important reason is that QLED's high-resolution patterning technology has not yet made a breakthrough.

When patterned quantum dot-like nanoparticles are produced, related art cannot prepare the patterned nanoparticles by a method of vapor deposition film formation and patterning due to the inorganic nanoparticle characteristics of the nanoparticles.

The related art generally produces patterned nanoparticles by inkjet printing, and it is difficult to achieve high resolution by this method. In order to improve the resolution of a product, related art produces patterned nanoparticles by photolithography, but the photolithography method includes an exposure process, which easily affects the performance of nanoparticles.

SUMMARY

One embodiment of the present disclosure provides a nanoparticle, including nanograin, and a first ligand and a second ligand connected to a surface of the nanograin, wherein the first ligand has alkali solubility, and the second ligand undergoes a crosslinking reaction when heated.

Optionally, the nanoparticle is a quantum dot which includes a core/shell-structured inorganic nanograin, wherein the first ligand and the second ligand are connected to a surface of the core/shell-structured inorganic nanograin.

Optionally, the first ligand includes one or more selected from carboxyl, phenolic hydroxyl, ester group, cyano group, 9-fluorenylmethyloxycarbonyl, and C1 to C20 halogenated alkyl.

Optionally, the second ligand comprises one or more selected from hydrocarbyl, alkynyl, and epoxy.

Optionally, the number of moles of the first ligand is greater than the number of moles of the second ligand.

One embodiment of the present disclosure provides a method for preparing a display substrate, including: (1) coating the above nanoparticle on a substrate to form a nanoparticle layer; (2) coating a photoresist on the nanoparticle layer, performing pre-baking treatment and then exposing the photoresist with a mask, to form a photoresist removal region and a photoresist reserved region; (3) developing to remove the photoresist in the photoresist removal region, such that the exposed nanoparticle layer is dissolved into an alkaline developing solution and is removed after being separated from the substrate; (4) performing post-baking treatment, such that a second ligand of the nanoparticle covered by the photoresist in the photoresist reserved region undergoes a crosslinking reaction and the nanoparticle layer covered by the photoresist in the photoresist reserved region is fixed on the substrate; and (5) stripping the photoresist in the photoresist reserved region, to complete a patterning of the nanoparticle layer.

Optionally, the nanoparticle is a quantum dot.

Optionally, the quantum dot is coated on a substrate by employing at least one process of spin coating, slot coating, and blade coating.

Optionally, the operation of the above (1) to (5) are performed repeatedly, to obtain a patterned quantum-dot layer in a plurality of colors corresponding to a plurality of light-emitting sub-pixels.

Optionally, when the photoresist in the photoresist reserved region is stripped, a stripping solution is a polar organic solution.

One embodiment of the present disclosure also provides a display device, including: a display substrate having a patterned nanoparticle layer, wherein the nanoparticle layer comprises a nanoparticle which comprises nanograin, and a first ligand, a second ligand and a crosslinked product of the second ligand connected to a surface of the nanograin, with the first ligand having alkali solubility, and with the second ligand undergoing a crosslinking reaction when heated.

As compared with the related art, the nanoparticle of the embodiments of the present disclosure has two kinds of ligands connected to its surface, in which the first ligand has alkali solubility, and the second ligand undergoes a crosslinking reaction when heated. A patterning of the nanoparticle layer during the preparation of the display substrate can be achieved by combining the nanoparticle of such structure with a photolithography process.

DETAILED DESCRIPTION

Figure 1:
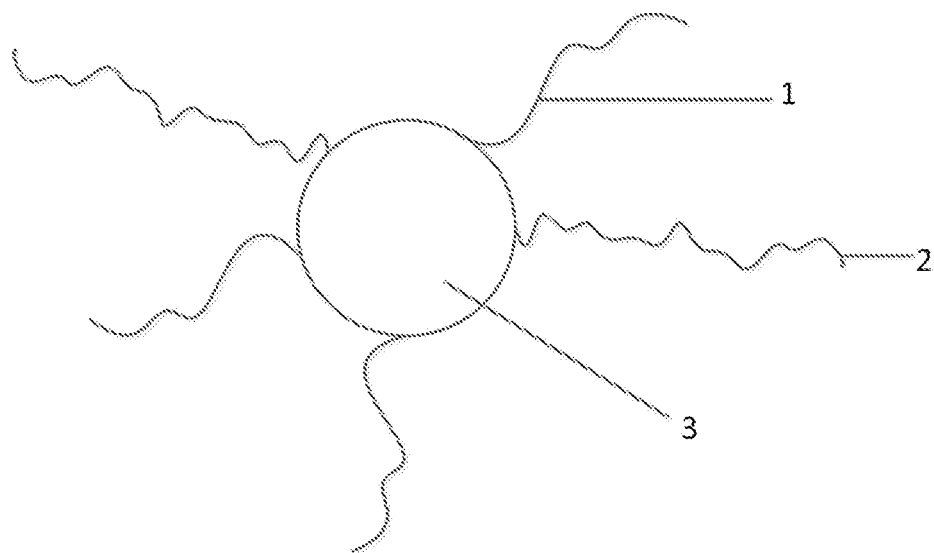
FIG. 1 is a schematic view showing the structure of a nanoparticle according to one embodiment of the present disclosure.

In order to better understand the present disclosure, the optional embodiments of the present disclosure will be described below in combination with Examples, but it should be understood that these descriptions are merely used to further illustrate the features and advantages of the present disclosure and are not intended to limit the present disclosure.

Unless otherwise defined, technical terms or scientific terms used herein have the normal meaning commonly understood by one skilled in the art in the field of the present disclosure. The words "first", "second", and the like used in the present disclosure does not denote any order, quantity, or importance, but rather merely serves to distinguish different components. Similarly, the words "one", "a/an" and the like do not denote any quantitative limitation, but rather denote at least one. The "including", "comprising", and the like used in the present disclosure means that the element or item appeared in front of the word encompasses the element or item and their equivalents listed after the word, and does not exclude other elements or items. The word "connected" or "connecting" and the like are not limited to physical or mechanical connections, but may include electrical connections and chemical connections (e.g., by a coordination bond), whether direct or indirect. "On", "under", "left", "right" and the like are only used to represent relative positional relationships, and when the absolute position of the described object is changed, the relative positional relationship may also be changed, accordingly.

It will be understood that when an element, such as a layer, film, region, or substrate, is referred to as being "on" or "under" another element, the element may be directly "on" or "under" another element, or there may be an intermediate element.

In the present disclosure, the numbers in the drawings are merely examples, and may actually be more or less.

The present disclosure discloses a nanoparticle, as shown in FIG. 1, comprising nanograin 3, and a first ligand 1 and a second ligand 2 connected to a surface of the nanograin, wherein the first ligand 1 has alkali solubility, and the second ligand 2 undergoes a crosslinking reaction when heated.

The nanograin refer to microscopic grain of the order of nanometers.

In one embodiment of the present disclosure, the nanoparticle is a quantum dot which includes a core/shell-structured inorganic nanograin, wherein the first ligand and the second ligand are connected to a surface of the core/shell-structured inorganic nanograin.

When the nanoparticle is a quantum dot, the quantum dot includes a core/shell structure inorganic nanograin, and a first ligand and a second ligand connected to a surface of the core/shell structure inorganic nanograin, wherein the first ligand has alkali solubility, and the second ligand undergoes a crosslinking reaction when heated.

The first ligand is capable of reacting with an alkaline solution and being dissolved in an alkaline solution. Optionally, the first ligand includes one or more selected from carboxyl, phenolic hydroxyl, ester group, cyano group, 9-fluorenylmethyloxycarbonyl (Fmoc), and C1 to C20 halogenated alkyl. Further, the first ligand is a compound represented by the following formula (1).

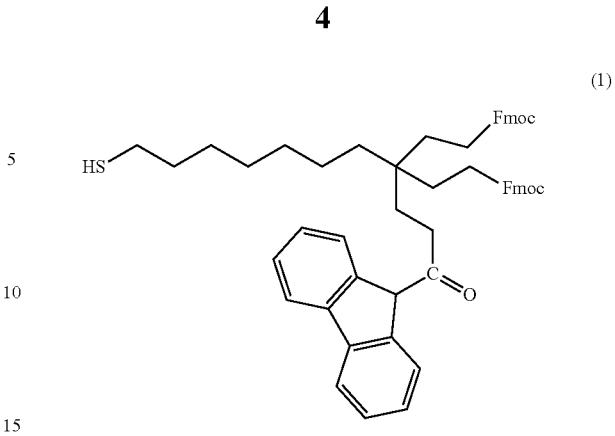

The second ligand is capable of undergoing a crosslinking reaction when heated. Optionally, the second ligand comprises one or more selected from hydrocarbyl, alkynyl, and epoxy. Hydrocarbyl may optionally be a terminal hydrocarbyl, alkynyl may optionally be a terminal alkynyl. Further, the second ligand is a compound represented by the following formula (2).

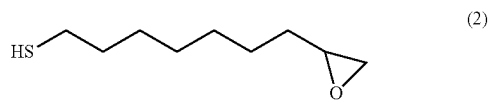 [SMILES: SCCCCCCCC1CO1]

When the second ligand is a compound represented by the formula (2), a self-crosslinking may occur, or a crosslinking may occur under conditions in which the catalyst is aniline.

Optionally, the number of moles of the first ligand connected to the surface of the nanoparticle is more than one third of the total number of moles of ligands.

When the nanoparticles are quantum dots, the method for preparing the quantum dot includes: obtaining a quantum dot with pyridine on its surface by contacting a quantum-dot raw material with pyridine; and contacting the quantum dot with pyridine on its surface with the first ligand and the second ligand to obtain the above quantum dot, with the first ligand having alkali solubility, and with the second ligand undergoing a crosslinking reaction when heated.

In some embodiments, a quantum dot with pyridine on its surface is obtained as follows: contacting the quantum-dot raw material with pyridine as a solvent in a weight ratio of greater than 1:1 at a normal temperature and a normal pressure for 5 min to 10 h while stirring, and then separating the quantum dot with pyridine on its surface by centrifugation.

In some embodiments, the quantum-dot raw material has at least one ligand selected from trioctylphosphine, trioctylphosphine oxide, oleylamine, and oleic acid.

In some embodiments, the quantum-dot raw material comprises at least one of a red quantum-dot raw material, a green quantum-dot raw material, and a blue quantum-dot raw material.

In some embodiments, the contacting the quantum dot with pyridine on its surface with the first ligand and the second ligand is performed as follows: dissolving the quantum dot with pyridine on its surface into toluene, adding excess amounts of the first ligand and the second ligand, stirring for 1 h to 3 h, precipitating by methanol, and then obtaining the above quantum dot by centrifugation.

Optionally, the number of moles of the first ligand is greater than the number of moles of the second ligand.

Further, the molar ratio of the first ligand to the second ligand is from 6:4 to 9:1. Further, the molar ratio of the first ligand to the second ligand is from 7:3 to 8.5:1.5. Further, the molar ratio of the first ligand to the second ligand is 4:1.

A ligand exchange occurs when a quantum dot with pyridine surface is brought into contact with the first ligand and the second ligand, in which the first ligand and the second ligand are usually bonded to the surface of the nanograin by a sulfur bond.

One embodiment of the present disclosure disclose a method for preparing a display substrate, including: (1) coating the above nanoparticle on a substrate to form a nanoparticle layer; (2) coating a photoresist on the nanoparticle layer, performing pre-baking treatment and then exposing the photoresist with a mask, to form a photoresist removal region and a photoresist reserved region; (3) developing to remove the photoresist in the photoresist removal region, such that the exposed nanoparticle layer is dissolved into an alkaline developing solution and is removed after being separated from the substrate; (4) performing post-baking treatment, such that a second ligand of the nanoparticle covered by the photoresist in the photoresist reserved region undergoes a crosslinking reaction, and the nanoparticle layer covered by the photoresist in the photoresist reserved region is fixed on the substrate; and (5) stripping the photoresist in the photoresist reserved region, to complete a patterning of the nanoparticle layer.

The display substrate can be prepared with a higher resolution and a convenient process, and thus is suitable for large-scale production. The preparation method has an improved process yield and is suitable for large-scale production.

Hereinafter, a method for preparing a display substrate, which mainly relates to preparing a patterned quantum-dot layer, will be described in detail with reference to FIGS. 2A to 2F.

Figure 2A:
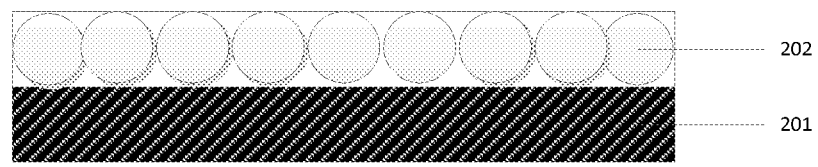
FIGS. 2A to 2F are process diagrams showing the patterning of a nanoparticle layer during preparation of a display substrate according to one embodiment of the present disclosure.

(1) As shown in FIG. 2A, the above nanoparticle is coated on a substrate 201 to form a nanoparticle layer 202.

Optionally, the nanoparticle is coated on a substrate by employing at least one process of spin coating, slot coating, and blade coating.

Figure 2B:
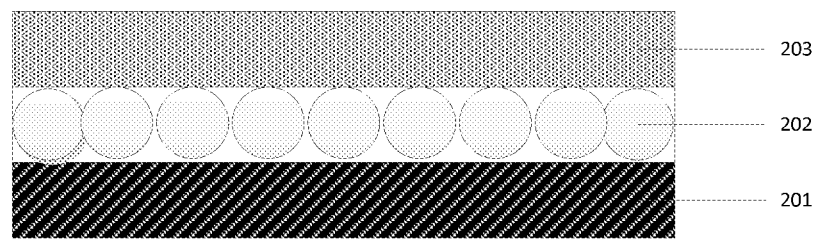
Figure 2C:
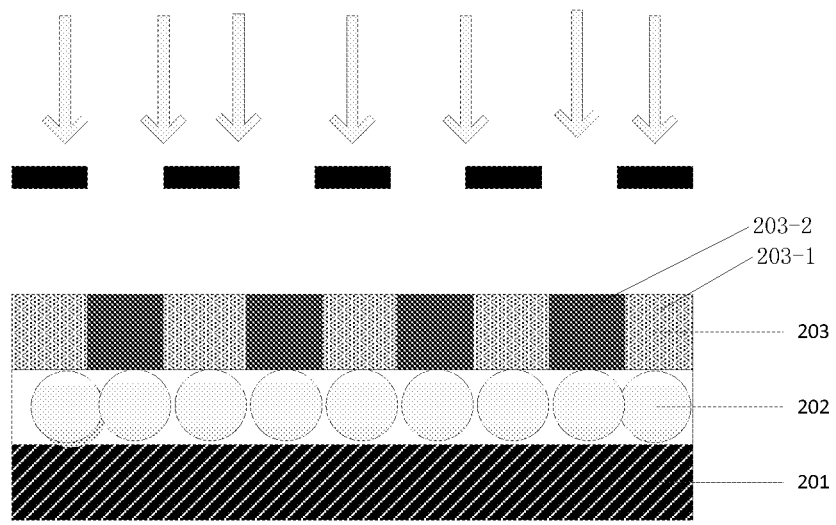

(2) As shown in FIG. 2B, a positive photoresist 203 is coated on the nanoparticle layer 202, a pre-baking treatment is performed, as shown in FIG. 2C, the positive photoresist 203 is exposed with a mask, to form a photoresist removal region 203-2 and a photoresist reserved region 203-1.

In the embodiment of the present disclosure, in order to avoid the bleaching effect of ultraviolet light on the nanoparticles, a positive photoresist is coated on the quantum-dot layer.

The photoresist removal area will be removed during subsequent development process; and the photoresist reserved region is the portion remaining after developing and is removed in the final stripping process.

Figure 2D:
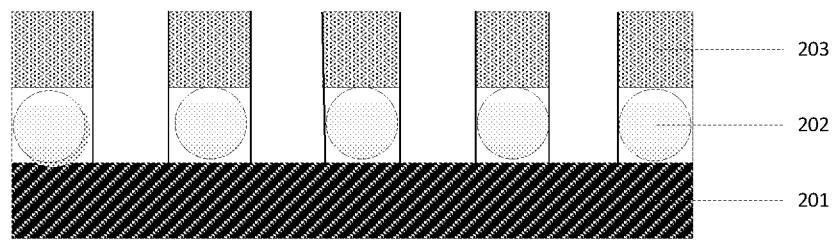

(3) As shown in FIG. 2D, a developing treatment is performed to remove the photoresist in the photoresist removal region 203-2, such that the exposed nanoparticle layer is dissolved into an alkaline developing solution and is removed after being separated from the substrate.

In the development treatment, the alkaline developing solution may be an aqueous solution of tetramethylammonium hydroxide (TMAH). The photoresist in the photoresist removal region 203-2 is dissolved in the alkaline developing solution and removed.

After removing the photoresist in the photoresist removal region, a portion of the nanoparticle layer is exposed, and the nanoparticle of this portion is capable of reacting with an alkaline developing solution and being dissolved in the alkaline solution due to the first ligand connected to its surface. Therefore, the nanoparticle of this portion is dissolved in an alkaline developing solution and is removed after being separated from the substrate.

In this process, the dissolution rate of the exposed nanoparticle layer is relatively slow and is easy to be controlled, so that it is possible to prevent the nanoparticle layer covered by the photoresist in the photoresist reserved region from being dissolved.

When the first ligand is a compound represented by the above formula (1), the response equation of the nanoparticle with the first ligand and the alkaline developing solution is shown as follows.

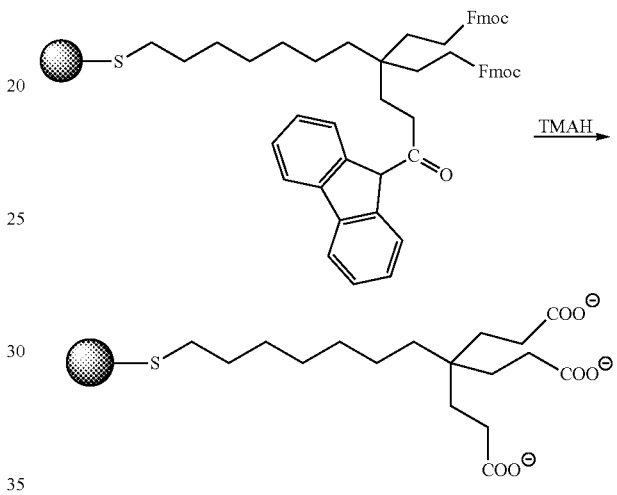

Figure 2E:
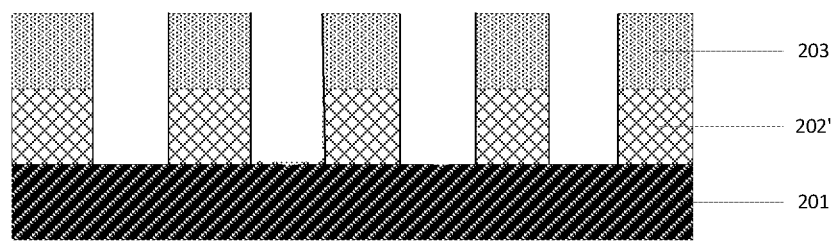

(4) As shown in FIG. 2E, a post-baking treatment is performed, such that a second ligand of the nanoparticle covered by the photoresist in the photoresist reserved region undergoes a crosslinking reaction, and the nanoparticle layer 202' covered by the photoresist in the photoresist reserved region is fixed on the substrate.

In the post-baking treatment, the heating temperature is optionally from 150° C. to 300° C.

The nanoparticle layer covered by the photoresist in the photoresist reserved region form a crosslinked network structure due to the crosslinking reaction of its second ligand by heating, and thus is fixed on the substrate to form a tightly connected structure between the nanoparticle layer and the substrate.

Figure 2F:
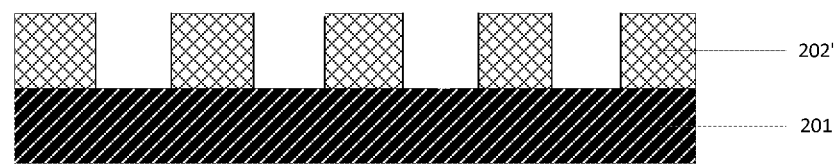

(5) As shown in FIG. 2F, a photoresist in the photoresist reserved region is stripped, to complete a patterning of the nanoparticle layer 202'.

Figure 3:
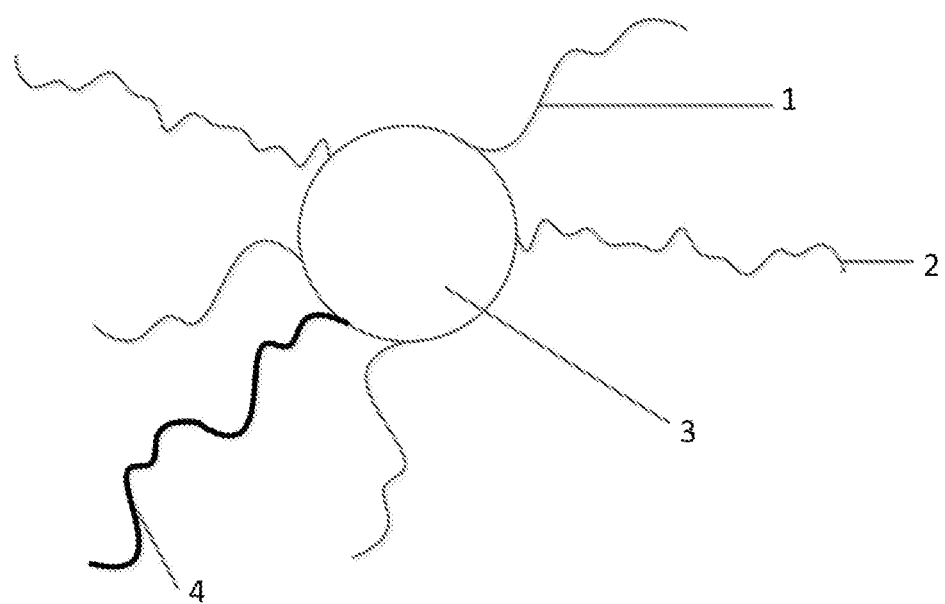
FIG. 3 is a schematic view showing the structure of a nanoparticle in a patterned nanoparticle layer according to one embodiment of the present disclosure.

The structure of the nanoparticle in the patterned nanoparticle layer, as shown in FIG. 3, includes nanograin 3, and a first ligand 1, a second ligand 2 and a crosslinked product 4 of the second ligand connected to a surface of the nanograin.

Optionally, when the photoresist in the photoresist reserved region is stripped, a stripping solution is a polar organic solution, such as a solution of ethanolamine in dimethyl sulfoxide (DMSO).

The photoresist in the photoresist reserved region is dissolved in the stripping solution, while a crosslinked structure has been formed among the nanoparticles in the nanoparticle layer, and thus the nanoparticle layer is insoluble in the stripping solution. Therefore, only the photoresist in the photoresist reserved region is stripped, while the nanoparticle layer is reserved on the substrate.

Optionally, the nanoparticle may be a quantum dot. Thus, the term "display substrate" in the context of the present disclosure refers to a substrate containing light-emitting diodes, in which the light-emitting diodes include quantum dots capable of being used for light emitting.

Optionally, in one embodiment of the present disclosure, the nanoparticle is a quantum dot, a method for preparing a display substrate includes the follow steps.

(1') Coating the above quantum dot on a substrate to form a quantum-dot layer.

Optionally, the quantum dot is coated on a substrate by employing at least one process of spin coating, slot coating, and blade coating.

The substrate may be a substrate on which a first electrode is formed or a substrate on which other necessary structures are formed.

(2') Coating a positive photoresist on the quantum-dot layer, performing pre-baking treatment and then exposing the positive photoresist with a mask, to form a photoresist removal region and a photoresist reserved region.

In the embodiment of the present disclosure, in order to avoid the bleaching effect of ultraviolet light on the quantum dots, a positive photoresist is coated on the quantum-dot layer.

The photoresist removal area will be removed during subsequent development; and the photoresist reserved region is the portion remaining after developing and is removed in the final stripping process.

(3') Performing developing treatment to remove the photoresist in the photoresist removal region, such that the exposed quantum-dot layer is dissolved into an alkaline developing solution is removed after being separated from the substrate.

In the development treatment, the alkaline developing solution may be an aqueous solution of tetramethylammonium hydroxide (TMAH). The photoresist in the photoresist removal region is dissolved in the alkaline developing solution and removed.

After removing the photoresist in the photoresist removal region, a portion of the quantum-dot layer is exposed, and the quantum dot of this portion is capable of reacting with an alkaline developing solution and being dissolved in the alkaline solution due to the first ligand connected to its surface. Therefore, the quantum dot of this portion is dissolved in an alkaline developing solution and is removed after being separated from the substrate.

In this process, the dissolution rate of the exposed quantum-dot layer is relatively slow and is easy to be controlled, so that it is possible to prevent the quantum-dot layer covered by the photoresist in the photoresist reserved region from being dissolved.

When the first ligand is a compound represented by the above formula (1), the response equation of the quantum dot with the first ligand and the alkaline developing solution is shown as follows.

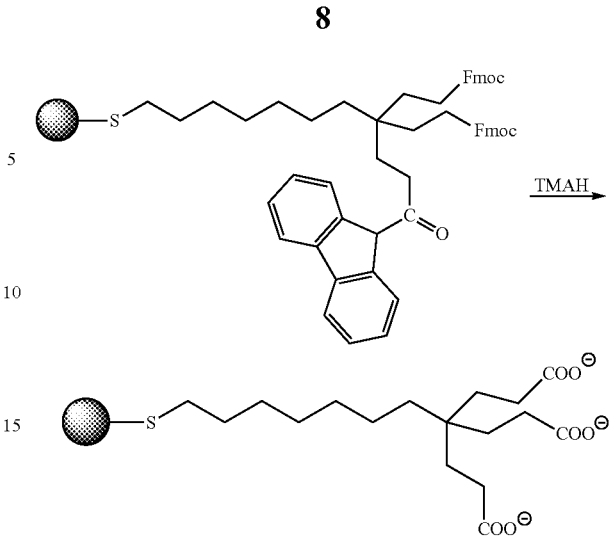

(4') Performing post-baking treatment, such that a second ligand of the quantum dot covered by the photoresist in the photoresist reserved region undergoes a crosslinking reaction, and the quantum-dot layer covered by the photoresist in the photoresist reserved region is fixed on the substrate.

In the post-baking treatment, optionally, the heating temperature is optionally from 150° C. to 300° C.

The quantum-dot layer covered by the photoresist in the photoresist reserved region form a crosslinked network structure due to the crosslinking reaction of its second ligand by heating, and thus is fixed on the substrate to form a tightly connected structure between the quantum-dot layer and the substrate.

(5') Stripping the photoresist in the photoresist reserved region, to complete a patterning of the quantum-dot layer.

Optionally, when the photoresist in the photoresist reserved region is stripped, a stripping solution is a polar organic solution, such as a solution of ethanolamine in dimethyl sulfoxide (DMSO).

The photoresist in the photoresist reserved region is dissolved in the stripping solution, while a crosslinked structure has been formed between the quantum dots in the quantum-dot layer, and thus the quantum-dot layer is insoluble in the stripping solution. Therefore, only the photoresist in the photoresist reserved region is stripped, while the quantum-dot layer is reserved on the substrate.

Optionally, the above (1) to (5) are performed repeatedly, to obtain a patterned quantum-dot layer in a plurality of colors corresponding to a plurality of light-emitting sub-pixels. The display substrate includes a substrate and a plurality of light-emitting sub-pixels arranged on the substrate, each of the light-emitting sub-pixels including a quantum-dot layer.

In some examples, the quantum-dot layer includes quantum dots and other organic light-emitting materials, in which each of the light-emitting sub-pixels includes a first electrode, a quantum-dot layer, and a second electrode formed in sequence on the substrate.

In some embodiments, the first electrode is an anode, the second electrode is a cathode, and each of the light-emitting sub-pixels further includes a hole injection layer and a hole transport layer arranged between the first electrode and the quantum-dot layer, in which the light-emitting subpixel further includes an electron injection layer and an electron transport layer arranged between the second electrode and the quantum-dot layer.

In some embodiments, the first electrode is a cathode, the second electrode is an anode, and each of the light-emitting sub-pixels further includes a hole injection layer and a hole transport layer arranged between the second electrode and the quantum-dot layer, in which the light-emitting subpixel further includes an electron injection layer and an electron transport layer arranged between the first electrode and the quantum-dot layer.

One embodiment of the present disclosure also discloses a display device including the display substrate prepared by the above method.

The disclosure is further described below in combination with specific embodiments, but the disclosure is not limited to the following embodiments.

Example 1

1. A quantum dot was prepared by using the ligand exchange method with CdTe as a core.
2. A CdTe quantum dot with trioctylphosphine or oleic acid as a ligand was prepared or purchased.
3. The CdTe quantum with trioctylphosphine or oleic acid as a ligand was added into 100 mL of pyridine and stirred for 1 h. The solution was concentrated and then added with ethanol to precipitate the quantum dot. The precipitate (quantum dot) was collected by centrifugation, in which the ligand connected on the surface of the CdTe quantum dot was replaced by pyridine at this moment.
4. The precipitate was dissolved in toluene, into which an excess amount of the first ligand represented by the above formula (1) and the second ligand represented by the above formula (2) were added.

The molar ratio of the first ligand to the second ligand is 8:2. After the solution is stirred for 1 h, methanol was further added to precipitate the quantum dot, the ligand of which was converted into the first ligand and the second ligand. The precipitate obtained at the lower layer after centrifugation was the desired quantum dot. After drying, the quantum dots were preserved by being dissolved in toluene or n-hexane.

Example 2

1. A 35 nm thick layer of red quantum dots was spin coated on a substrate.
2. A positive photoresist was spin coated on the red quantum-dot layer, followed by pre-baking and exposure.
3. Development was performed. During the development process, the exposed positive photoresist was removed, and thus the quantum dots beneath the removed photoresist lose the protection of the photoresist. The first ligand reacted with an alkaline developing solution (such as TMAH aqueous solution) to become water-soluble, so that the red quantum dots were dissolved in the developing solution and separated from the substrate. Thus, the quantum dots that need to be reserved were protected by the photoresist and reserved on the substrate.
4. A post-baking treatment was performed, such that the red quantum dots protected by the photoresist subjected to a thermal crosslinking, thereby fixing the protected red quantum dots on the substrate.
5. It was immersed in the stripping solution to remove the photoresist, and to complete the patterning of the red quantum dots.
6. A 35 nm thick layer of green quantum dots was spin coated, and the above operations 2 to 5 was repeat, to complete the patterning of the green quantum dots.
7. A 35 nm thick layer of blue quantum dots was spin coated, and the above operations 2 to 5 was repeat, to complete the patterning of the blue quantum dots.

Example 3

1. A TFT (Thin Film Transistor) backplate was prepared. Specifically, the transparent substrate is cleaned by a standard method, and then the following steps are performed in sequence: 200 nm thick gate metal Mo is deposited and patterned; 150 nm thick gate dielectric $SiO_2$ is deposited; 40 nm thick active layer IGZO is deposited and patterned; 200 nm thick source and drain metal Mo is deposited and patterned; 300 nm thick passivation layer $SiO_2$ is deposited and patterned; 40 nm thick pixel electrode ITO is deposited and patterned; finally, acrylic material is spin-coated and photoetched to cure an approximately 1.5 microns thick pixel definition layer, thereby forming a TFT backplane portion.
2. A hole injection layer and a hole transport layer were prepared on a TFT backplate by using a spin coating process. For example, the hole injection layer may be formed by spin coating with PEDOT:PSS in a thickness of about 30 nm, and the hole transport layer may be formed by spin coating with PVK or TFB in a thickness of about 40 nm.
3. Operations 1 to 7 in Example 2 were repeated on the hole transport layer, to complete the patterning of R/G/B quantum dots.
4. ZnO nanoparticles were coated on the quantum-dot layer, to form an electron transport layer and an electron injection layer.
5. A 200 nm thick aluminum layer was vapor deposited on the ZnO nanoparticle layer as a cathode.
6. An AMQLED display panel was obtained by packaging.

The description of the above Examples is merely used for helping to understand the method according to the embodiments of the present disclosure and its core concept. It should be noted that a person skilled in the art may make further improvements and modifications to the embodiments of the present disclosure without departing from the principle/spirit of the embodiments of the present disclosure, and these improvements and modifications shall also fall within the scope of the embodiments of the present disclosure.

The above description of the disclosed Examples allows one skilled in the art to implement or use the embodiments of the present disclosure. Various modifications to these Examples would be apparent to one skilled in the art, and the general principles defined herein may be applied to other Examples without departing from the spirit or scope of the embodiments of the present disclosure. Therefore, the embodiments of the present disclosure will not be limited to the Examples shown herein, but should conform to the widest scope consistent with the principles and novel features disclosed herein.

What is claimed is:
1. A nanoparticle, comprising:
nanograin, and
a first ligand and a second ligand connected to a surface of the nanograin,
wherein the first ligand has alkali solubility and is phenolic hydroxyl, cyano group, 9-fluorenylmethyloxycarbonyl or C1 to C20 halogenated alkyl,
wherein the second ligand undergoes a crosslinking reaction when heated and is hydrocarbyl or epoxy, and wherein the molar ratio of the first ligand to the second ligand is from 6:4 to 9:1.

2. The nanoparticle of claim 1, wherein the nanoparticle is a quantum dot which comprise a core/shell-structured inorganic nanograin, wherein the first ligand and the second ligand are connected to a surface of the core/shell-structured inorganic nanograin.

3. A method for preparing a display substrate, comprising:
   (1) coating the nanoparticle of claim 1 on a substrate to form a nanoparticle layer;
   (2) coating a photoresist on the nanoparticle layer, exposing the photoresist with a mask, to form a photoresist removal region and a photoresist reserved region;
   (3) developing to remove the photoresist in the photoresist removal region, such that the exposed nanoparticle layer is dissolved into an alkaline developing solution and is removed from the substrate;
   (4) performing post-baking treatment, such that a second ligand of the nanoparticle covered by the photoresist in the photoresist reserved region undergoes a crosslinking reaction and the nanoparticle layer covered by the photoresist in the photoresist reserved region is fixed on the substrate; and
   (5) stripping the photoresist in the photoresist reserved region, to complete a patterning of the nanoparticle layer.

4. The method of claim 3, wherein the nanoparticle is a quantum dot.

5. The method of claim 4, wherein the above (1) to (5) are performed repeatedly, to obtain a patterned quantum-dot layer in a plurality of colors corresponding to a plurality of light-emitting sub-pixels.

6. The method of claim 3, wherein when the photoresist in the photoresist reserved region is stripped, a stripping solution is a polar organic solution.

7. A display device, comprising a display substrate having a patterned nanoparticle layer, wherein the nanoparticle layer comprises a nanoparticle which comprises nanograin and a first ligand, a second ligand and a crosslinked product of the second ligand connected to a surface of each nanograin,
   wherein the first ligand has alkali solubility and is phenolic hydroxyl, cyano group, 9-fluorenylmethyloxycarbonyl or C1 to C20 halogenated alkyl,
   wherein the second ligand undergoes a crosslinking reaction when heated and is hydrocarbyl or epoxy, and
   wherein the molar ratio of the first ligand to the second ligand is from 6:4 to 9:1.

8. The display device of claim 7, wherein the nanoparticle is a quantum dot which comprises a core/shell-structured inorganic nanograin, and the first ligand, the second ligand and the crosslinked product of the second ligand are connected to a surface of the core/shell-structured inorganic nanograin.

9. A method for preparing the nanoparticle of claim 1, comprising:
   (1) forming a nanoparticle with pyridine on its surface by contacting a nanoparticle raw material with pyridine; and
   (2) contacting the nanoparticle with pyridine on its surface with the first ligand and the second ligand to obtain the nanoparticle, with the first ligand having alkali solubility, and with the second ligand undergoing a crosslinking reaction when heated,
   wherein the nanoparticle comprises:
   nanograin, and
   a first ligand and a second ligand connected to a surface of the nanograin,
   wherein the first ligand has alkali solubility and is phenolic hydroxyl, cyano group, 9-fluorenylmethyloxycarbonyl or C1 to C20 halogenated alkyl,
   wherein the second ligand undergoes a crosslinking reaction when heated and is hydrocarbyl or epoxy, and
   wherein the molar ratio of the first ligand to the second ligand is from 6:4 to 9:1.

10. The method of claim 9, wherein
    the forming the nanoparticle with pyridine on its surface comprises: contacting the nanoparticle raw material with pyridine as a solvent in a weight ratio of greater than 1:1 at a normal temperature and a normal pressure for 5 min to 10 h while stirring, and then separating the nanoparticle with pyridine on its surface by centrifugation; and
    the contacting the nanoparticle with pyridine on its surface with the first ligand and the second ligand comprises: dissolving the nanoparticle with pyridine on its surface into toluene, adding an excessive amount of the first ligand and the second ligand, stirring for 1 h to 3 h, precipitating by methanol, and then obtaining the nanoparticle by centrifugation.

\* \* \* \* \*